(12) United States Patent
Kazama

(10) Patent No.: US 7,081,767 B2
(45) Date of Patent: Jul. 25, 2006

(54) ELECTROCONDUCTIVE CONTACT UNIT

(75) Inventor: Toshio Kazama, Nagano (JP)

(73) Assignee: NHK Spring Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/482,301

(22) PCT Filed: Jul. 1, 2002

(86) PCT No.: PCT/JP02/06647

§ 371 (c)(1),
(2), (4) Date: Jul. 13, 2004

(87) PCT Pub. No.: WO03/005042

PCT Pub. Date: Jan. 16, 2003

(65) Prior Publication Data

US 2004/0239355 A1    Dec. 2, 2004

(30) Foreign Application Priority Data

Jul. 2, 2001    (JP)    ............................. 2001-201262

(51) Int. Cl.
*G01R 1/73*    (2006.01)
(52) U.S. Cl. ...................... 324/757; 324/761
(58) Field of Classification Search .................. None
See application file for complete search history.

(56) References Cited

U.S. PATENT DOCUMENTS

| | | | |
|---|---|---|---|
| 5,521,519 A | 5/1996 | Faure et al. | |
| 6,246,245 B1 | 6/2001 | Akram et al. | |
| 6,499,216 B1 * | 12/2002 | Fjelstad | ........................ 29/842 |
| 6,812,723 B1 * | 11/2004 | Mikami | ....................... 324/761 |

FOREIGN PATENT DOCUMENTS

| | | |
|---|---|---|
| EP | 0685742 | 6/1994 |
| EP | 742682 | 11/1996 |
| JP | 1287484 | 11/1989 |
| JP | 4351968 | 12/1992 |
| JP | 645268 | 6/1994 |
| JP | 6249878 | 9/1994 |
| JP | 9119945 | 5/1997 |
| JP | 100038918 | 2/1998 |
| JP | 11160355 | 6/1999 |
| JP | 11160404 | 6/1999 |
| JP | 200135578 | 2/2001 |
| WO | WO 98/29751 | 7/1998 |
| WO | WO 03/005043 | 1/2003 |

OTHER PUBLICATIONS

International Search Report of PCT/JP02/06647 dated Oct. 15, 2002.
Translation of International Preliminary Examination Report of PCT/JP02/06647 dated Apr. 6, 2004.

* cited by examiner

*Primary Examiner*—Ernest Karlsen
(74) *Attorney, Agent, or Firm*—Pearl Cohen Zedek Latzer, LLP

(57) ABSTRACT

In the electroconductive contact unit of the present invention, a gold plated layer 8 is formed over the surface of an electroconductive needle member 2 via a Ni under layer 7a, and a layer of iridium (titanium nitride, rhodium or hafnium nitride) is formed on the gold plated layer 8 of the needle portion 2a by sputtering, via an Ni under layer 7b. Thereby, the tip portion is provided with an improved resistance to oxidization and wear without using any special material for the needle member, and the durability of the needle member is improved so that the running cost can be minimized.

11 Claims, 7 Drawing Sheets

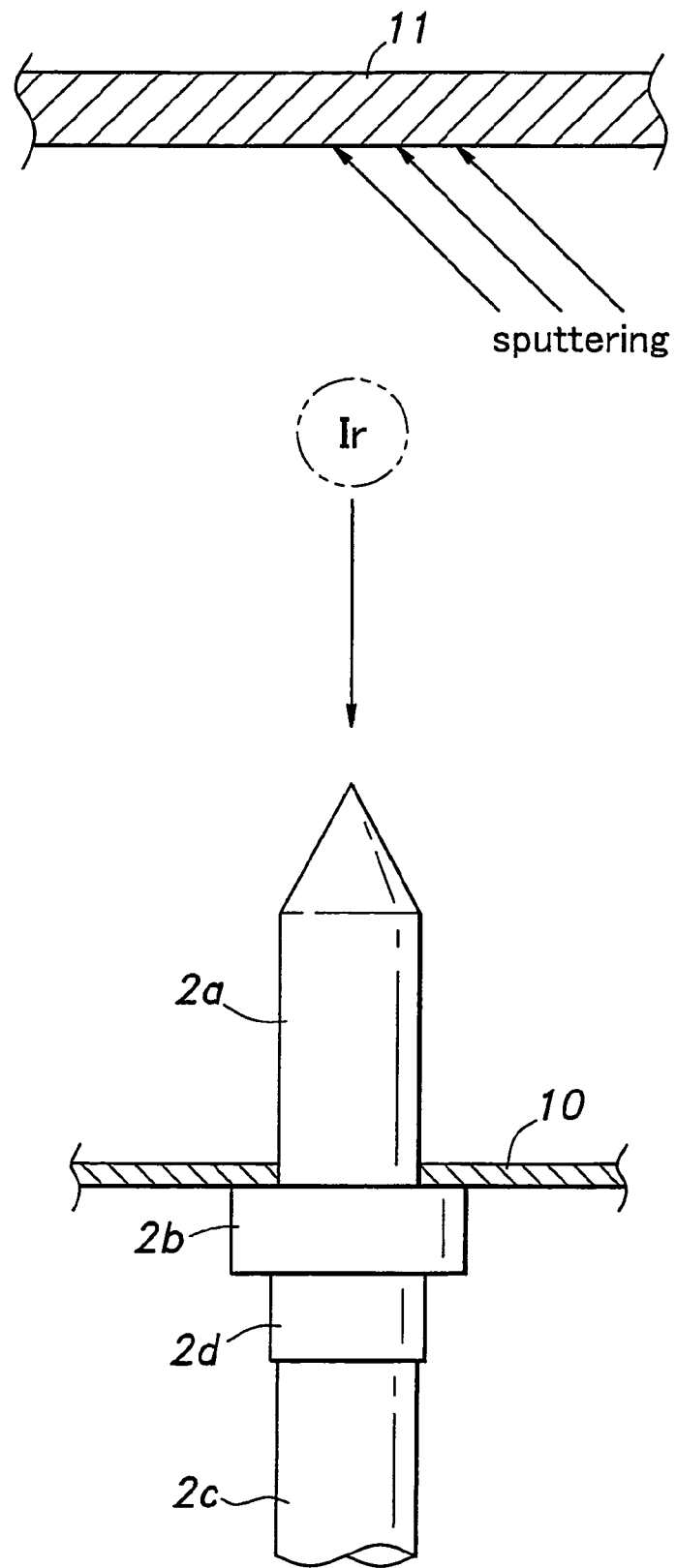

ELECTROCONDUCTIVE CONTACT UNIT

CROSS-REFERENCE TO RELATED APPLICATIONS

This application is a National Phase Application of PCT International Application No. PCT/JP02/06647, International Filing Date Jul. 1, 2002, claiming priority of Japanese Patent Application JP 2001-210262, filed 02 Jul. 2001.

TECHNICAL FIELD

The present invention relates to an electroconductive contact unit for exchanging signals with printed circuit boards, electronic devices or the likes.

BACKGROUND OF THE INVENTION

A conventional electroconductive contact unit for use in contact probes for electrically testing conductor patterns of printed circuit boards and electronic devices typically comprises an electroconductive needle member and a tubular holder that receives the needle member in an axially moveable manner, and the needle member is resiliently urged by a coil spring in the direction to project the tip of the needle member from the front end of the holder so that the tip of the needle member may be resiliently brought into contact with an object to be tested.

Silicon wafers and ceramic packages for use with semiconductor devices and glass panels for use in LCD panels are made of materials having a relatively high hardness. These components are provided with electric circuitry, and are subjected to electric testing during the manufacturing process. An electroconductive contact unit (contact probe) is used for such a purpose, and is adapted to establish electric contact with a part of the circuitry such as a terminal.

When the object to be tested consists of a component made of a hard material such as those mentioned earlier, and the contact probe uses needle members made of conventional SK material (carbon tool steel), repeated use of the needle members will result in the wear and deformation of the contact points in time. As a result, a stable contact resistance may eventually become impossible. Therefore, the needle members are required to be replaced in a relatively short period of time, and this increases the running cost.

SUMMARY OF THE INVENTION

In view of such problems of the prior art and to provide an electroconductive contact unit which is resistant to wear and highly durable, the electroconductive contact unit of the present invention includes an electroconductive needle member, and a coil spring resiliently urging the needle member in a direction to bring a tip portion of the needle member into contact with an object to be contacted, and is characterized by that: the tip portion of the needle member is integrally formed with electroconductive material resistant to oxidization and wear.

Thereby, the tip portion of the needle member can be made resistant to oxidization and wear, and is prevented from being worn or deformed even when the object to be tested consists of material having a high hardness. Thus, the wear resistance and durability of the needle member is improved, and a stable contact resistance is ensured.

In particular, by forming a plating of a highly electroconductive material at least on the remaining part of the needle member which is not integrally formed with the electroconductive material, even when the electroconductive material does not have an adequately high electroconductivity owing to a greater weight placed on increased resistance to oxidization and wear, the electric path between the tip portion of the needle member and the part thereof connected to the coil spring can be plated with highly electroconductive material so that the electric resistance of the electric path between the needle member and coil spring can be minimized.

The electroconductive material may consist of any of iridium, titanium nitride, rhodium and hafnium nitride either by itself or as an alloy with gold or platinum. The favorable properties of iridium, titanium nitride, rhodium and hafnium nitride such as a high hardness, resistance to heat and acid and stable contact resistance can be fully taken advantage of so that the tip portion of the needle member is given with an improved wear resistance and durability, and a favorable conductive state (such as a stable contact resistance) can be achieved owing to the stable mechanical contact.

If the iridium, titanium nitride, rhodium, hafnium nitride or alloy of any one of them with gold or platinum is provided via an under layer for preventing peeling, the under layer ensures a secure attachment of such material to the needle member even when a direct application of such material to the needle member would fail to provide an adequate force of attachment. Therefore, the electroconductive unit can be given with a desired wear resistance and durability.

By using gold for the highly electroconductive material that is plated, even when the electroconductive material does not have an adequately high electroconductivity because of a greater weight placed on increased resistance to oxidization and wear, the needle member may be given with a high electroconductivity as a whole.

If the gold plating is formed over the entire surface of the needle member, and the iridium, titanium nitride, rhodium, hafnium nitride or alloy of any one of them with gold or platinum is provided via an under layer for preventing peeling, the gold plating that is provided over the entire surface of the needle member ensures a high electroconductivity for the needle member as whole, and the under layer ensures a strong attachment of the material such as iridium to the needle member. Also, the gold plated layer under the material such as iridium conducts electricity, and provides an even more favorable electric property.

If a gold plating is formed on the outer surface of the iridium, titanium nitride, rhodium, hafnium nitride or alloy of any one of them with gold or platinum, the material such as iridium improves the wear resistance, and the gold plated layer reduces the electric resistance of the needle member as a whole. Even when the gold plated layer is worn or deformed and the under layer made of such material as iridium is exposed, the presence of the gold plated layer adjacent to such an exposed part helps the electric conductivity of the needle member to be kept high as a whole.

BRIEF DESCRIPTION OF THE DRAWINGS

Now the present invention is described in the following with reference to the appended drawings, in which:

FIG. 4 is a schematic view showing how the sputtering process is conducted;

DETAILED DESCRIPTION OF THE PREFERRED EMBODIMENTS

Preferred embodiments of the present invention are described in the following with reference to the appended drawings.

Figure 1:
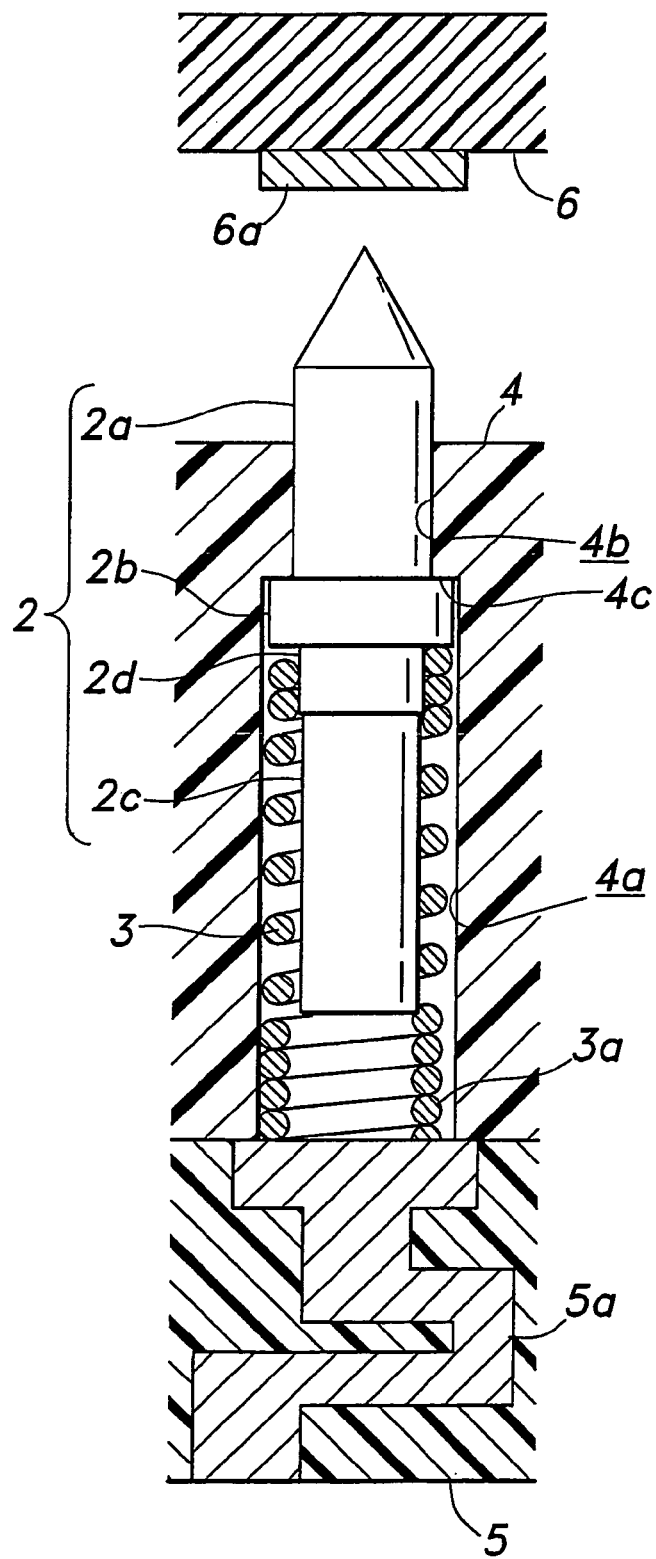
FIG. 1 is a vertical sectional view of an electroconductive contact unit for use in a contact probe embodying the present invention.

FIG. 1 is a vertical sectional view showing an electroconductive contact unit 1 for use in a contact probe embodying the present invention. This electroconductive contact unit 1 may be used by itself, but is particularly suitable for use in a holder (probe head) of a multipoint contact probe as one of a large number of similar electroconductive contact units that are arranged one next to another, for instance for a wafer level test. In such a contact probe, the holder is integrally attached to a board mounted on a testing machine via a relay circuit board. The drawing is for illustration purpose only, and the actual aspect ratio may differ from that of the illustrated example.

The electroconductive contact unit 1 comprises an electroconductive needle member 2, a compression coil spring 3 and a holder 4 made of electrically insulating material and defining a large diameter holder hole 4a and a small diameter holder hole 4b in a coaxial relationship for receiving the electroconductive needle member 2 and compression coil spring 3 therein. The electroconductive needle member 2 comprises a needle portion 2a having a pointed end, a flange portion 2b provided in the rear end of the needle portion 2a and having a more enlarged diameter than the needle portion 2a, and a stem portion 2c projecting from the other end (the lower end in the drawing) of the flange portion 2b and having a more reduced diameter than the flange portion 2b. These portions 2a, 2b and 2c are each provided with a circular cross section, and disposed in a mutually coaxial relationship.

The part of the stem portion 2c of the electroconductive needle member 2 adjacent to the flange portion 2b is formed as an enlarged diameter portion 2d having a slightly larger diameter than the rest of the stem portion 2c. The enlarged diameter portion 2d is press fitted into an end of the compression coil spring 3, and the corresponding coil end thereby resiliently wraps around the enlarged diameter portion 2d. The electroconductive needle member 2 is connected to the compression coil spring 3 in this manner. The connection between the enlarged diameter portion 2d and the corresponding end of the compression coil spring 3 can be accomplished not only by the resilient wrapping described above but also by other means such as soldering. In regard to how the compression coil spring 3 is wound, the one end portion connected to the enlarged diameter portion 2d consists of a closely wound portion, and the intermediate portion consists of a coarsely wound portion while the other coil end portion is provided with a closely wound portion 3a having a prescribed length.

The small diameter holder hole 4b of the holder 4 axially slidably receives the cylindrical portion of the needle portion 2a, and the large diameter holder hole 4a receives the flange portion 2b, enlarged diameter portion 2d, stem portion 2c and compression coil spring 3. The lower surface of the holder 4 in the drawing is attached to a relay circuit board 5 which closes the open end of the large diameter holder hole 4a. The relay circuit board 5 is fixedly attached to the holder 4 by threaded bolts not shown in the drawing, and is provided with an internal circuitry 5a having a terminal surface opposing the large diameter holder hole 4a.

As shown in the drawing, when the holder 4 and relay circuit board 5 are assembled to each other, the electroconductive needle member 2 is prevented from coming off from the holder hole by the flange portion 2b being engaged by a shoulder 4c defined between the small diameter holder hole 4b and large diameter holder hole 4a. The axial length of the large diameter holder hole 4a is determined in such a manner that the compression coil spring 3 is subjected to a prescribed initial load by a compressive deformation thereof. The axial lengths of the stem portion 2c and closely wound portion 3a are determined in such a manner that the lower end of the stem portion 2c in the drawing engages the closely wound portion 3a in the illustrated initial state (prior to the test).

Figure 2:
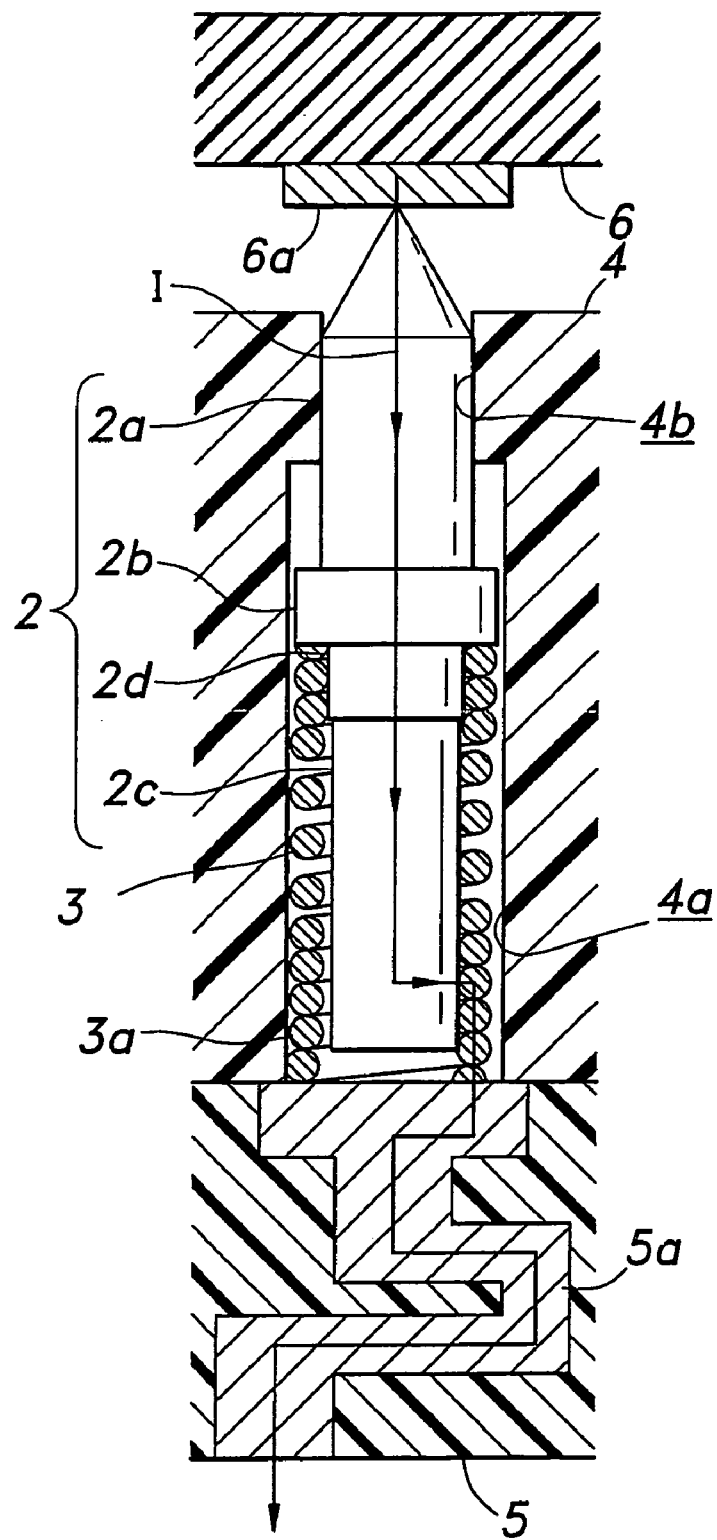
FIG. 2 is a view similar to FIG. 1 showing the contact unit brought into contact with an object.

Referring to FIG. 2, by engaging the tip of the needle member 2a onto an object to be tested such as a pad 6a made of Au, Cu or Al and formed on the surface of the wafer 6, an electric signal I is transmitted from the side of the wafer 6 to the relay circuit board 5 via the needle member 2 and compression coil spring 3. The signal is then forwarded to a control system not shown in the drawing via a circuit board not shown in the drawing connected to the relay circuit board 5, and a desired test can be conducted.

In the initial state, the stem portion 2c is in contact with the closely wound portion 3a, and a reliable contact between the stem portion 2c and closely wound portion 3a can be ensured at the time of testing as shown in FIG. 2. The electric signal I is conducted axially through the electroconductive needle member 2, and then to the closely wound portion 3a. As can be readily appreciated, the electric signal can flow axially through the closely wound portion 3a of the compression coil spring 3, instead of along a spiral path, so that the inductance of the electroconductive contact unit 1 can be effectively minimized.

Figure 3:
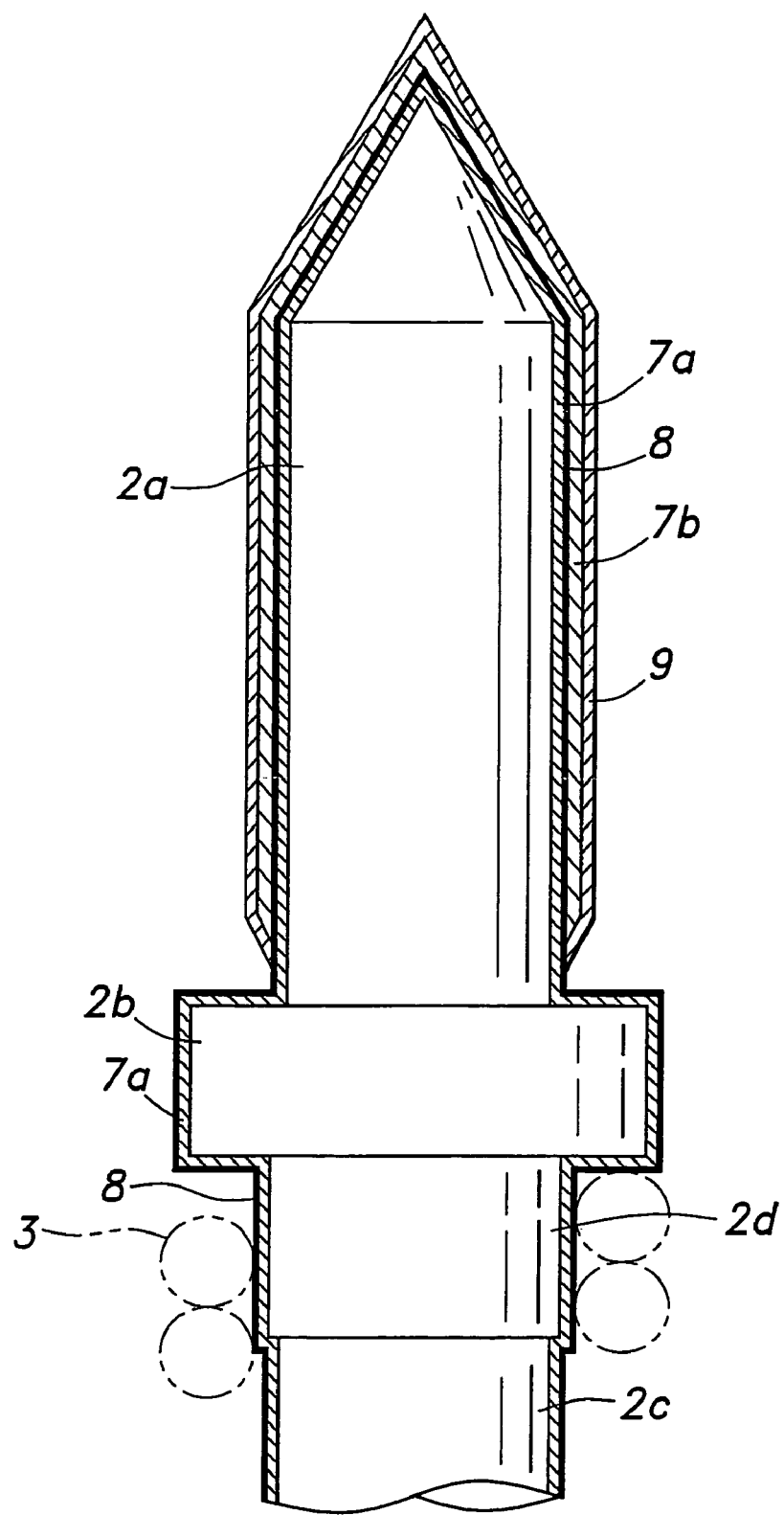
FIG. 3 is an enlarged fragmentary sectional view of the needle member having an iridium layer coated thereon.

In this electroconductive contact unit 1, as shown in FIG. 3, the entire surface of the electroconductive needle member 2 is formed with a gold plated layer 8 via a Ni under layer 7a, and the needle portion 2a is additionally formed with an iridium layer 9 via a Ni under layer 7b on top of the gold plated layer 8. The Ni under layer 7a improves the attachment of the gold plated layer 8. The iridium layer 9 may consist of either iridium or an iridium alloy.

An example of the structures of the various layers is given in the following. The needle member 2 including the needle portion 2a, flange portion 2b, stem portion 2c and enlarged diameter portion 2d all in a coaxial arrangement is generally Ni plated so as to form a Ni under layer 7a, and is gold plated thereon to form a gold plated layer 8 which is highly electroconductive and wear resistant.

As shown in FIG. 4, the electroconductive needle member 2 formed with the gold plated layer 8 is held by a fixture 10 at the base end (adjacent to the flange portion 2b) of the needle portion 2a. A Ni under layer 7b having a thickness of 1 μm or less is formed on the part of the needle portion 2a exposed from the fixture 10, and the needle portion 2a still held by the fixture 10 is exposed to an Ir target 11 so that sputtering may be conducted thereon from above and sideways. Iridium (or an alloy thereof) which is resistant to oxidization, wear resistant and electroconductive is thus sputtered over the entire surface of the needle portion 2a so as to form an iridium layer 9 having a thickness of approximately 0.5 μm or less. The needle portion 2a is held by the fixture 10 by clamping as illustrated in FIG. 4, but may also by hooking the flange portion 2b onto a fixture, and the orientation of the needle portion may also be horizontal or inverted as desired.

Iridium was used in the illustrated embodiment, but the present invention is not limited by this selection of the material, and there are other materials that can achieve a similar result such as titanium nitride (TiN), rhodium (Rh) and hafnium nitride (HfN). A titanium nitride layer can be formed simply by replacing the iridium target of the foregoing embodiment with a titanium nitride target. Rhodium may be used as a layer of an alloy of platinum and rhodium formed by sputtering a mixture of platinum and rhodium In regard to titanium nitride, by sputtering both titanium nitride and gold or platinum in a nitrogen environment, a layer of an alloy of titanium nitride and gold or platinum can formed. Similarly, in regard to hafnium nitride, by sputtering both hafnium nitride and gold or platinum in a nitrogen environment, a layer of an alloy of hafnium nitride and gold or platinum can formed. The rhodium, titanium nitride and hafnium nitride layers that can be used in place of the iridium layer 9 can provide a similar performance, and the tip of the needle member 2 can be made electroconductive, resistant to oxidization and wear resistant.

According to this arrangement, it is possible to benefit from the advantages of such materials as iridium, titanium nitride, rhodium and hafnium nitride. The advantages include high hardness, resistance to heat and acid, and a stable contact resistance. In particular, the wear resistance and durability of the tip of the needle portion 2a can be improved, and a conductance based on a highly stable mechanical contact can be ensured (the contact resistance can be made stable). Because the alloy layer or metallic layer can be formed by plating or sputtering, the advantages of the present invention can be gained without modifying the existing shape of the electroconductive needle member, and this prevents a rise in the manufacturing cost.

Because only the part that may wear or deform due to impacts and pressure is required to be processed for an increased hardness (such as the formation of an iridium layer in the foregoing embodiment), the remaining part of the needle member may be coated with a highly electroconductive material such as a gold plated layer. For instance, because the enlarged diameter portion which is press fitted into the compression coil spring is provided with a gold plated layer 8, the contact resistance between the press fitted part of the compression coil spring and the needle member can be minimized. Therefore, even when a part of the electric signal I flows via the press fitted part of the compression coil spring 3, the influence from the resulting contact resistance can be minimized.

FIG. 2 shows the way the electric signal I flows, and it can be seen that the electric signal I flows through the contact portion between the stem portion 2c of the needle member 2 and the closely wound portion 3a of the coil spring 3. In this case, the electric signal flows through the needle member 2 mostly via the gold plated layer 8 owing to the skin effect. The electric signal may be conducted by the iridium layer 9 at the tip of the needle portion 2a, but because the gold plated layer 8 is formed in the lower layer of the needle portion 2a the electric signal also flows through the gold plated layer 8. In this manner, having the gold plated layer 8 formed over the entire surface of the needle member 2 produces a highly desirable result. Also, the gold plated layer 8 on the stem portion 2c is beneficial when soldering the coil spring 3 thereto. The gold plated layer 8 ensures the corrosion resistance of the needle member 2, and allows the material of the needle member 2 to be selected relatively freely without regard to the electroconductivity or corrosion resistance thereof.

The Ni under layer 7b was formed before forming the iridium layer 9 because iridium is resistant to oxidization and wear and electroconductive but cannot be coated directly over the gold plated layer 8 without difficulty. By the intervention of the Ni under layer 7, the coating strength (resistance to peeling) of iridium can be significantly improved. The material for this under layer 7 is not limited to Ni, but may also be others as long as they can improve the resistance of iridium against peeling.

When the iridium layer 9 was formed on the surface of the tip of the needle member 2, the diameter of the tip was approximately 5 µm or less after it was applied to a glass plate one million times and the wear of the iridium layer 9 was relatively insignificant. When the needle member was only coated with a gold plated layer, the diameter of the tip was approximately 20 µm or more after it was applied to a glass plate one million times and the underlying metal was exposed.

The tip of the needle portion 2a was provided with a pointed conical shape in the illustrated embodiment, but the shape is not limited by this example. For instance, the tip may be formed as any of those illustrated in FIGS. 5a to 5c. The one illustrated in FIG. 5a has a conical shape having a rounded tip. The one illustrated in FIG. 5b is shaped as a combination of a plurality of prismatic shapes. The one illustrated in FIG. 5c is provided with a blunt and flat end surface. The shape of the tip can be suitably selected according to the shape of the object to be contacted. For instance, the one illustrated in FIG. 5c is suitable for contact with a solder ball.

Figure 5A:
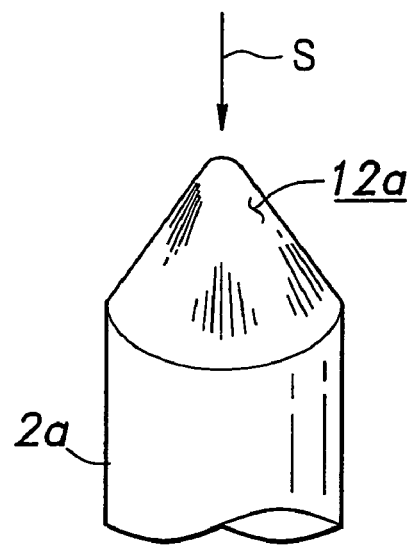
FIGS. 5a, 5b and 5c are enlarged fragmentary views showing different shapes of the tip of a needle member.
Figure 5B:
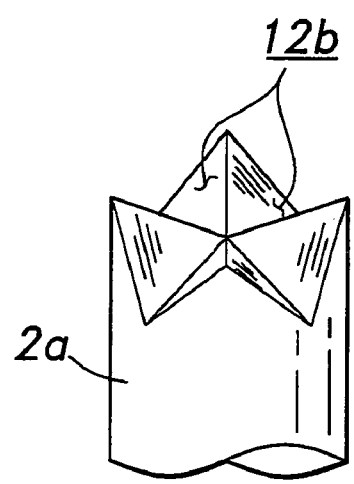
Figure 5C:
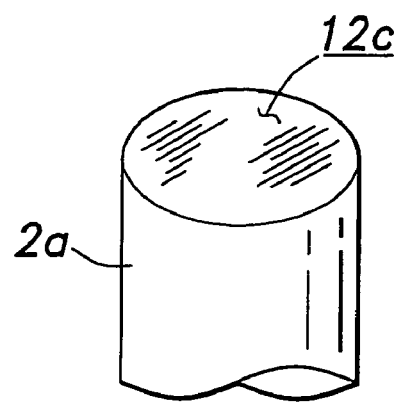

Furthermore, by orienting the sputtering direction as represented by arrow S in FIG. 5a, the iridium layer may be formed only on each of the faces 12a, 12b and 12c (tip of the needle member) directed toward the sputtering direction. In such a case, the iridium layer is formed only on the surface that is to be contacted with an object to be contacted, and the material cost can be minimized.

In the foregoing embodiment, the electroconductive contact unit had only one end that is moveable. However, the present invention can be applied to electroconductive contact units having two moveable ends, and those using an electroconductive needle member that is supported as a cantilever. In such a case, it suffices if at least the tip (the part that comes into contact with the object to be contacted) of the needle member is integrally provided with material which is resistant to oxidization and wear and electroconductive such as iridium.

Figure 6:
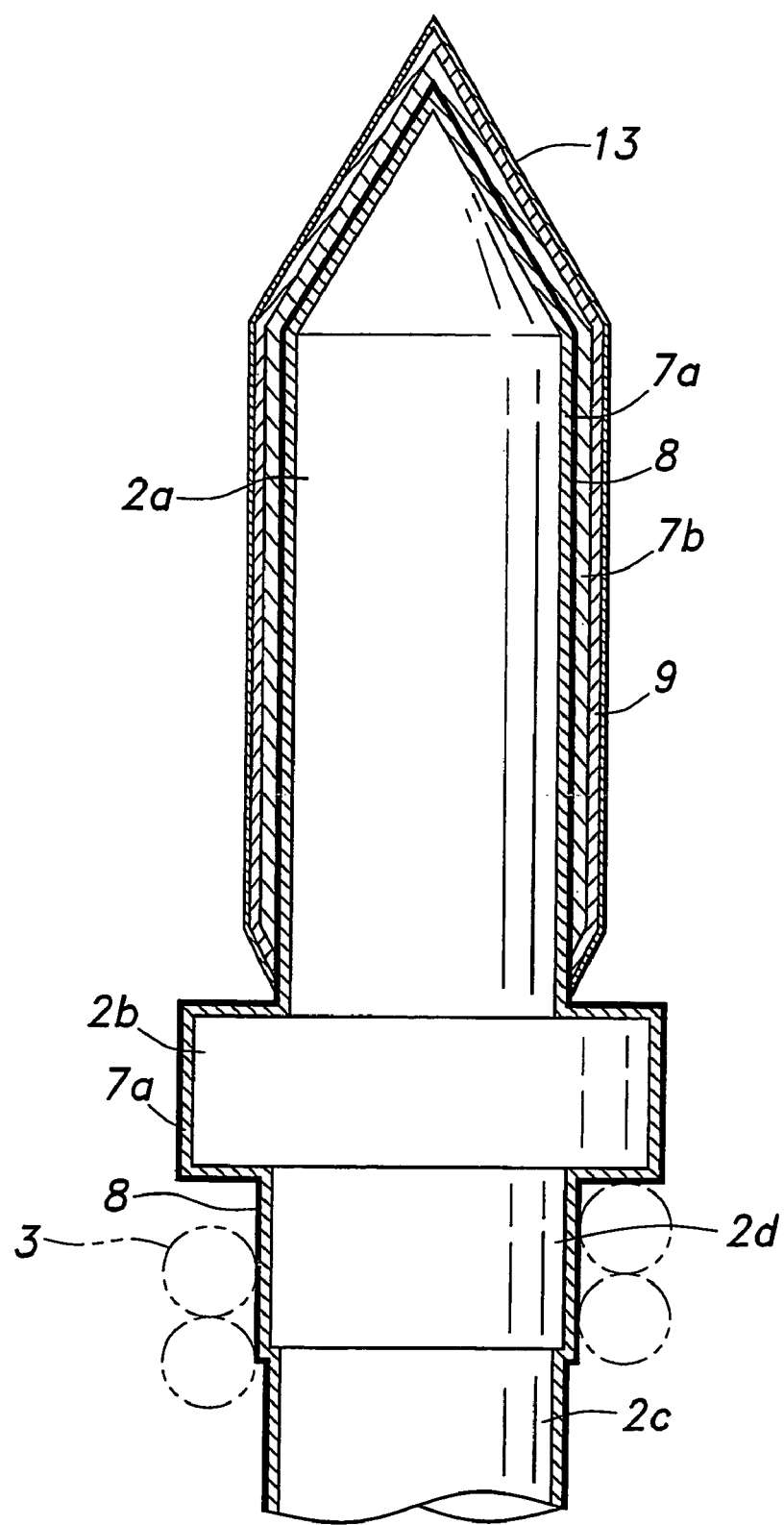
FIG. 6 is a view similar to FIG. 3 showing another embodiment of the present invention.

As illustrated in FIG. 6, an additional gold plated layer 13 may be formed on the surface of the iridium layer 9. In this arrangement, the iridium layer 9 provides the required resistance to wear and the gold plated layer 13 provides the corrosion resistance and low electric resistance, and an needle member providing an even more stable contact resistance can be achieved. Even when the gold plated layer 13 has worn out or deformed and the underlying iridium layer 9 is exposed, owing to the gold plated layer 13 still remaining around the exposed portion, a high electric conductivity of the needle member 2 can be maintained as a whole.

In the illustrated embodiments, the gold plated layer 8 was formed over the entire surface of the needle member 2, and the iridium layer 9 was formed only on the tip of the needle member 2 on top of the gold plated layer 8, but the gold plated layer 8 may be omitted from the part where the iridium layer 9 is formed. In other words, the gold plated layer is required to be provided at least in the part (such as the flange portion 2b, enlarged diameter portion 2d and stem portion 2c in the case of the illustrated embodiments) where the iridium layer 9 is not formed.

Figure 7:
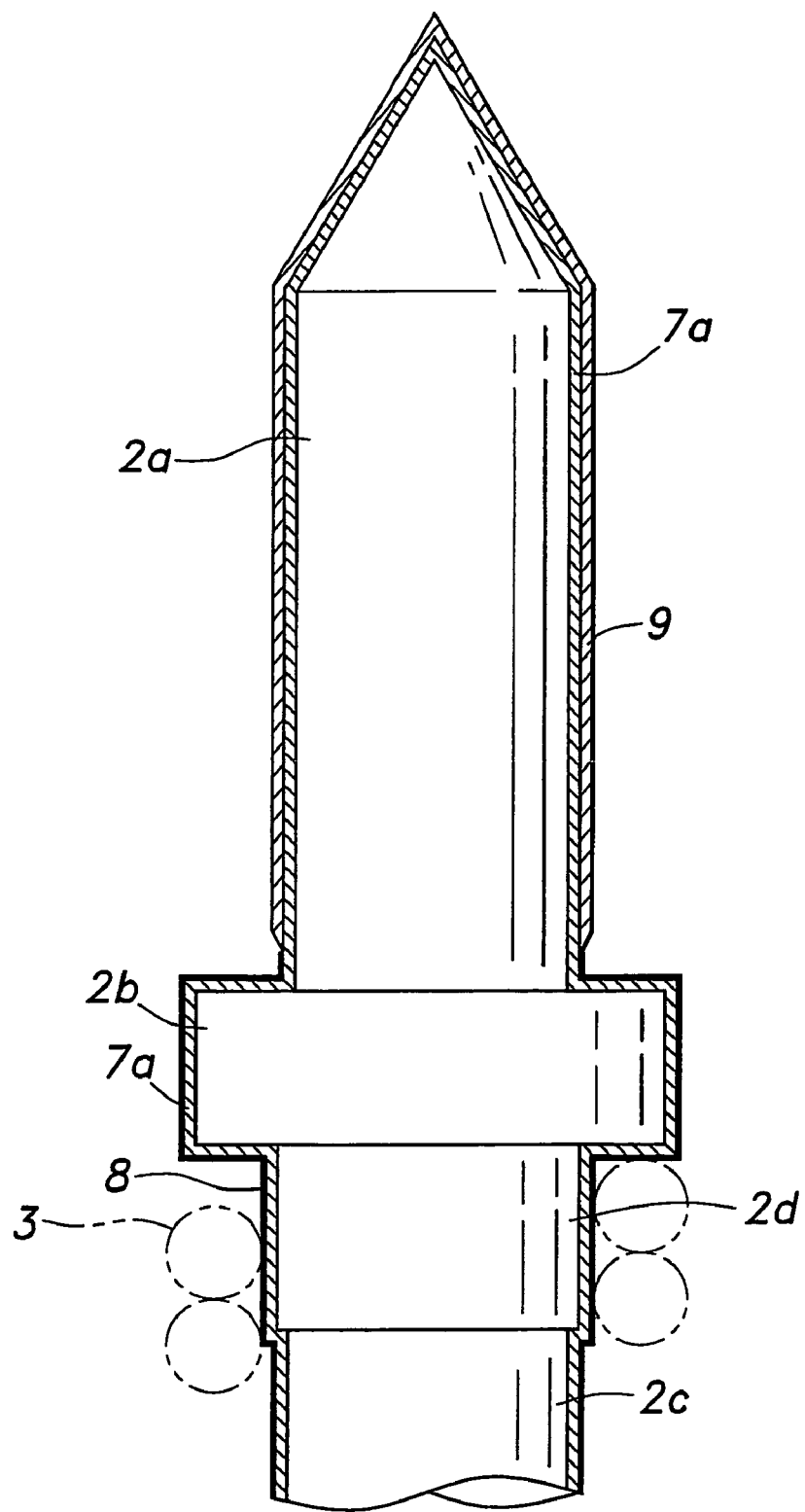
FIG. 7 is a view similar to FIG. 3 showing yet another embodiment of the present invention.

FIG. 7 illustrates such an example. The embodiment illustrated in FIG. 7 is similar to that illustrated in FIG. 3, and the corresponding parts thereof are denoted with like numerals without repeating the description of such parts. As shown in the drawing, a Ni under layer 7a is provided over the entire surface of the needle member 2, and an iridium layer 9 is formed on the needle portion 2a. The part where the iridium layer 9 is absent (the flange portion 2b, enlarged diameter portion 2d and stem portion 2c in the case of the illustrated embodiments) is formed with a gold plated layer 8. The order of forming these two layers 8 and 9 can be freely selected, and a mask may be used when forming each layer. In the case of the embodiment illustrated in FIG. 7, the electric signal flows first through the iridium layer 9 and then through the gold plated layer 8. When this is applied to the embodiment illustrated in FIG. 6, the electric signal can transmit from the gold plated layer 13 to the gold plated layer 8, and the favorable electric properties of gold can be even more fully taken advantage of.

Although the present invention has been described in terms of preferred embodiments thereof, it is obvious to a person skilled in the art that various alterations and modifications are possible without departing from the scope of the present invention which is set forth in the appended claims.

INDUSTRIAL APPLICABILITY

As can be appreciated from the foregoing embodiments, the tip of the needle member can be made highly resistant to oxidization and wear, and the wear resistance and durability of the electroconductive contact unit can be improved easily without using any special material for the needle member. For instance, even when material such as iridium not having a favorable electric conductance is used, the resistance of the electric path between the needle member and coil spring can be minimized by plating at least the remaining part of the needle member with material having a high electric conductivity. Therefore, the durability of the needle member is improved, and the running cost can be reduced.

In particular, by forming a gold plated layer over the entire surface of the needle member, and additionally forming a layer consisting of any of iridium, titanium nitride, rhodium and hafnium nitride either by itself or as an alloy with gold or platinum via an under layer for preventing peeling, even when the needle member is made of conventionally used material such as SK material, the gold plated layer reduces the electric resistance of the electric path extending from the tip of the needle member to the coil spring, and the under layer permits the material such as iridium to be firmly attached to the gold plated layer. Thereby, the favorable properties of the material such as iridium can be given to the needle member. The favorable properties include high hardness, resistance to heat and acid and a stable contact resistance. The gold plated layer provides a high electric conductivity in a stable manner.

By forming a gold plated layer on top of the layer of material such as iridium, the wear resistance can be increased owing to the material such as iridium, and a low electric resistance can be ensured owing to the gold plated layer at the same time. In such a case, even when the gold plated layer is worn or deformed and the underlying layer made of such material as iridium is exposed, the presence of the gold plated layer adjacent to such an exposed part helps the electric conductivity of the needle member as a whole to be kept high.

The invention claimed is:

1. An electroconductive contact unit, comprising:
   a holder member having a large diameter holder hole and a small diameter holder hole;
   an electroconductive needle member including at least a needle portion formed at an axial end thereof protruding through the small diameter holder hole and a stem portion formed at an opposite axial end thereof received by the large diameter holder hole; and
   a coil spring coaxially surrounding the stem portion and including at least a first end engaged with a part of the stem portion of the needle member and a second end fixed in relation to the holder member and electrically connected to a circuit board, the coil spring resiliently urging the needle member in a direction to bring the needle portion of the needle member into contact with an object to be contacted and providing an electroconductive path between the needle member and the circuit board,
   wherein, at least a tip portion of the needle portion of the needle member is formed with a layer of electroconductive material resistant to oxidization or wear comprising iridium, titanium nitride, rhodium or hafnium nitride either by itself or as an alloy with gold or platinum, or a combination thereof, and at least a part of the stem portion of the needle member comprises a plated layer of highly electroconductive material.

2. An electroconductive contact unit according to claim 1, wherein the layer of the electroconductive material resistant to oxidization and wear is formed via an under layer for preventing peeling.

3. An electroconductive contact unit according to claim 2, wherein the under layer comprises nickel.

4. An electroconductive contact unit according to claim 1, wherein the highly electroconductive material of the plated layer comprises gold.

5. An electroconductive contact unit according to claim 4, wherein the plated layer of gold is formed via an under layer.

6. An electroconductive contact unit according to claim 5, wherein the under layer comprises nickel.

7. An electroconductive contact unit according to claim 1, wherein the needle member comprises a flange between the needle portion and stem portion thereof to engage the first end of the coil spring, the first end of the coil spring and stem portion engaging each other via the plated layer of the highly electroconductive material.

8. An electroconductive contact unit according to claim 1, wherein the coil spring includes a closely would portion at which a rear end of the stem portion engages, the rear end of the stem portion being formed with the plated layer of the highly electroconductive material.

9. An electroconductive contact unti according to claim 1, wherein the plated layer of the highly electroconductive material substantially covers the needle member, and the layer of the electroconductive material resistant to oxidization and wear covers only the needle portion of the needle member.

10. An electroconductive contact unit according to claim 9, comprising an additional plated layer of gold formed over the layer of the electroconductive material resistant to oxidization and wear.

11. An electroconductive contact unit according to claim 1, wherein the plated layer of the highly electroconductive material covers only the stem portion of the needle member, and the layer of the electroconductive material resistant to oxidization and wear covers only the needle portion of the needle member.

* * * * *